US010276117B2

(12) United States Patent
Yang et al.

(10) Patent No.: US 10,276,117 B2
(45) Date of Patent: Apr. 30, 2019

(54) GATE LINE DRIVING CIRCUIT, CIRCUIT FOR OUTPUTTING AN EMISSION CONTROL SIGNAL, AND DISPLAY DEVICE

(71) Applicants: BOE Technology Group Co., Ltd., Beijing (CN); Beijing BOE Optoelectronics Technology Co., Ltd., Beijing (CN)

(72) Inventors: Shengji Yang, Beijing (CN); Xue Dong, Beijing (CN); Hailin Xue, Beijing (CN); Xiaochuan Chen, Beijing (CN); Haisheng Wang, Beijing (CN); Hongjuan Liu, Beijing (CN); Pengpeng Wang, Beijing (CN)

(73) Assignees: BOE Technology Group Co., Ltd., Beijing (CN); Beijing BOE Optoelectronics Technology Co., Ltd., Beijing (CN)

( * ) Notice: Subject to any disclaimer, the term of this patent is extended or adjusted under 35 U.S.C. 154(b) by 0 days.

(21) Appl. No.: 15/505,023

(22) PCT Filed: Jul. 7, 2016

(86) PCT No.: PCT/CN2016/089088
§ 371 (c)(1),
(2) Date: Feb. 17, 2017

(87) PCT Pub. No.: WO2017/067233
PCT Pub. Date: Apr. 27, 2017

(65) Prior Publication Data
US 2017/0287423 A1 Oct. 5, 2017

(30) Foreign Application Priority Data
Oct. 19, 2015 (CN) .......................... 2015 1 0680789

(51) Int. Cl.
*G09G 3/36* (2006.01)
*G06F 3/044* (2006.01)
(Continued)

(52) U.S. Cl.
CPC ........... *G09G 3/3674* (2013.01); *G06F 3/044* (2013.01); *G09G 3/32* (2013.01); *G09G 3/3233* (2013.01);
(Continued)

(58) Field of Classification Search
CPC ...... G09G 3/3674; G09G 3/32; G09G 3/3677; G09G 3/3688; G06F 3/044
(Continued)

(56) References Cited

U.S. PATENT DOCUMENTS 9,189,097 B2 * 11/2015 Kim .................... G06F 3/0416
2003/0160745 A1 8/2003 Osame et al.
(Continued)

FOREIGN PATENT DOCUMENTS

CN 103135868 A 6/2013
CN 103543869 A 1/2014
(Continued)

OTHER PUBLICATIONS

Oct. 18, 2016—(WO) International Search Report and Written Opinion Appn PCT/CN2016/089088 with English Tran.
(Continued)

*Primary Examiner* — Fred Tzeng
(74) *Attorney, Agent, or Firm* — Banner & Witcoff, Ltd.

(57) ABSTRACT

Provided are a gate line driving circuit, a circuit for outputting an emission control signal, and a display device, the problem that existing gate line driving circuit can output a synchronous driving signal is solved. The gate line driving circuit comprises a power input pin configured to input an effective voltage (VGH) for controlling a switching transis-
(Continued)

tor in a pixel region to be turned off, the power input pin inputs the effective voltage (VGH) in a display phase, and inputs a synchronous driving signal in a touch phase.

20 Claims, 8 Drawing Sheets

(51) Int. Cl.
    *G09G 3/32*     (2016.01)
    *G09G 3/3233*     (2016.01)

(52) U.S. Cl.
    CPC ......... *G09G 3/3677* (2013.01); *G09G 3/3688* (2013.01); *G09G 2300/0408* (2013.01); *G09G 2310/0248* (2013.01); *G09G 2330/021* (2013.01)

(58) Field of Classification Search
    USPC .......................................................... 345/92
    See application file for complete search history.

(56) References Cited

U.S. PATENT DOCUMENTS

| | | | |
|---|---|---|---|
| 2009/0115750 A1 | 5/2009 | Chen et al. | |
| 2010/0177023 A1 | 7/2010 | Han | |
| 2014/0184533 A1* | 7/2014 | Park | G06F 3/0412 |
| | | | 345/173 |
| 2017/0031524 A1* | 2/2017 | Shin | G06F 3/0412 |
| 2017/0235421 A1* | 8/2017 | Lin | G02F 1/134309 |
| | | | 345/173 |

FOREIGN PATENT DOCUMENTS

| | | |
|---|---|---|
| CN | 103680410 A | 3/2014 |
| CN | 104299652 A | 1/2015 |
| CN | 104850270 A | 8/2015 |
| CN | 105185318 A | 12/2015 |

OTHER PUBLICATIONS

Apr. 25, 2017—(CN) First Office Action Appn 201510680789.4 with English Tran.

* cited by examiner

US 10,276,117 B2

GATE LINE DRIVING CIRCUIT, CIRCUIT FOR OUTPUTTING AN EMISSION CONTROL SIGNAL, AND DISPLAY DEVICE

The application is a U.S. National Phase Entry of International Application No. PCT/CN2016/089088 filed on Jul. 7, 2016, designating the United States of America and claiming priority to Chinese Patent Application No. 201510680789.4 filed on Oct. 19, 2015. The present application claims priority to and the benefit of the above-identified applications and the above-identified applications are incorporated by reference herein in their entirety.

TECHNICAL FIELD

The present disclosure relates to a gate line driving circuit, a circuit for outputting an emission control signal, and a display device.

BACKGROUND

AMOLED (Active-matrix Organic Light Emitting Diode) displays are one of the hotspots in today's research field of flat panel displays, compared with LCD (liquid crystal displays), OLED displays have advantages of low power consumption, low cost, self-illumination, wide viewing angle, and fast response speed, and so on. Nowadays, OLED displays have begun to replace the traditional LCD screens in the display field such as mobile phone, PDA (Personal Digital Assistant), and digital camera.

At present, integrating the In Cell Touch technique and the AMOLED display technique to embed the touch control function into inside of the AMOLED screen body is a main research direction of panel manufacturers. According to the principles of In Cell Touch, there are strict requirements on the capacitance-to-ground of a touch detection unit (a touch sensor), the touch mode of the touch detection unit requires that all the electrodes (the touch electrode and other counter electrodes) have to be driven synchronously in a touch phase, so that an impact caused by the capacitance-to-ground on touch detection can be counteracted, this requires that driving voltages in respective paths must drive along with the driving of touch electrodes, so as to ensure that an amplitude of an output current of the OLED remains unchanged.

SUMMARY

The at least one embodiment of the present disclosure provides a gate line driving circuit, a circuit for outputting an emission control signal, and a display device. The gate line driving circuit can output a synchronous driving signal.

According to an aspect of the present disclosure, there is provided a gate line driving circuit, comprising a power input pin configured to input an effective voltage for controlling a switching transistor in a pixel region to be turned off, wherein the power input pin inputs the effective voltage in a display phase, and inputs a synchronous driving signal in a touch phase.

Optionally, the power input pin is a positive power input pin or a negative power input pin.

Optionally, the synchronous driving signal is a superimposed signal of the effective voltage and a touch driving signal.

Optionally, the power input pin is a positive power input pin, the gate line driving circuit comprises: a first thin film transistor, a first terminal of the first thin film transistor being inputted with a start signal, and a control terminal of the first thin film transistor being inputted with a first clock signal; a second thin film transistor, a first terminal of the second thin film transistor being inputted with the first clock signal, and a control terminal of the second thin film transistor being connected to the second terminal of the first thin film transistor; a third thin film transistor, a first terminal of the third thin film transistor being connected to a negative power input pin, and a control terminal of the third thin film transistor being inputted with the first clock signal; a fourth thin film transistor, a first terminal of the fourth thin film transistor being connected to the positive power input pin, and a control terminal of the fourth thin film transistor being connected to the second terminal of the third thin film transistor and the second terminal of the second thin film transistor; a fifth thin film transistor, a first terminal of the fifth thin film transistor being inputted with a first control signal which is phase-reversed with respect to the first clock signal, a control terminal of the fifth thin film transistor being connected to the second terminal of the first thin film transistor, and a second terminal of the fifth thin film transistor being connected to the second terminal of the fourth thin film transistor to form an output terminal of a gate line driving signal; a sixth thin film transistor, a first terminal of the sixth thin film transistor being connected to the positive power input pin, and a control terminal of the sixth thin film transistor being connected to the second terminal of the third thin film transistor and the second terminal of the second thin film transistor; a seventh thin film transistor, a first terminal of the seventh thin film transistor being connected to the second terminal of the sixth thin film transistor, a control terminal of the seventh thin film transistor being inputted with the first control signal, and a second terminal of the seventh thin film transistor being connected to the second terminal of the first thin film transistor and the control terminal of the fifth thin film transistor; a first capacitor, two terminals of the first capacitor being connected to the control terminal and the second terminal of the fifth thin film transistor, respectively; and a second capacitor, two terminals of the second capacitor being connected to the control terminal and the first terminal of the fourth thin film transistor, respectively.

Optionally, each of the first to seventh thin film transistors is a P-type thin film transistor.

According to another aspect of the present disclosure, there is provided a circuit for outputting an emission control signal, comprising: a second power input pin configured to input an effective voltage for controlling an emission control transistor in a pixel region to be turned on, the second power input pin inputs the effective voltage in a display phase, and inputs a synchronous driving signal in a touch phase.

Optionally, the second power input pin is a second positive power input pin or a second negative power input pin.

Optionally, the synchronous driving signal is a superimposed signal of the effective voltage and a touch driving signal.

Optionally, the second power input pin is a second negative power input pin, the circuit for outputting an emission control signal comprises: a first thin film transistor, a first terminal of the first thin film transistor being inputted with a start signal, and a control terminal of the first thin film transistor being inputted with a second clock signal; a second thin film transistor, a first terminal of the second thin film transistor being inputted with the second clock signal, and a control terminal of the second thin film transistor being connected to the second terminal of the first thin film transistor; a third thin film transistor, a first terminal of the third thin film transistor being connected to a negative power input pin, and a control terminal of the third thin film transistor being inputted with the second clock signal; a fourth thin film transistor, a first terminal of the fourth thin film transistor being connected to a positive power input pin, and a control terminal of the fourth thin film transistor being connected to the second terminal of the third thin film transistor and the second terminal of the second thin film transistor; a fifth thin film transistor, a first terminal of the fifth thin film transistor being inputted with a second control signal which is phase-reversed with respect to the second clock signal, a control terminal of the fifth thin film transistor being connected to the second terminal of the first thin film transistor, and a second terminal of the fifth thin film transistor being connected to the second terminal of the fourth thin film transistor to form a first output terminal; a sixth thin film transistor, a first terminal of the sixth thin film transistor being connected to the positive power input pin, and a control terminal of the sixth thin film transistor being connected to the second terminal of the third thin film transistor and the second terminal of the second thin film transistor; a seventh thin film transistor, a first terminal of the seventh thin film transistor being connected to the second terminal of the sixth thin film transistor, a control terminal of the seventh thin film transistor being inputted with the second control signal, and a second terminal of the seventh thin film transistor being connected to the second terminal of the first thin film transistor and the control terminal of the fifth thin film transistor; a first capacitor, two terminals of the first capacitor being connected to the control terminal and the second terminal of the fifth thin film transistor, respectively; a second capacitor, two terminals of the second capacitor being connected to the control terminal and the first terminal of the fourth thin film transistor, respectively; an eighth thin film transistor, a first terminal of the eighth thin film transistor being connected to the positive power input pin, and a control terminal of the eighth thin film transistor being connected to the first output terminal; a ninth thin film transistor, a first terminal of the ninth thin film transistor being connected to the negative power input pin, a control terminal of the ninth thin film transistor being inputted with the second clock signal, and a second terminal of the ninth thin film transistor being connected to the second terminal of the eighth thin film transistor; a tenth thin film transistor, a first terminal of the tenth thin film transistor being connected to the positive power input pin, and a control terminal of the tenth thin film transistor being connected to the first output terminal; an eleventh thin film transistor, a first terminal of the eleventh thin film transistor being connected to the second negative power input pin, a control terminal of the eleventh thin film transistor being connected to the second terminal of the eighth thin film transistor and the second terminal of the ninth thin film transistor, and a second terminal of the eleventh thin film transistor being connected to the second terminal of the tenth thin film transistor to form an emission control signal output terminal; and a third capacitor, one terminal of the third capacitor being connected to the second terminal of the eighth thin film transistor, the second terminal of the ninth thin film transistor and the control terminal of the eleventh thin film transistor, and the other terminal of the third capacitor being inputted with the second control signal.

According to further another aspect of the present disclosure, there is provided a display device, comprising: the gate line driving circuit described above, and/or the circuit for outputting an emission control signal described above.

The gate line driving circuit, the circuit for outputting an emission control signal, and the display device provided by the at least one embodiment of the present disclosure have changed the input signal from the power input pin (configured to input an effective voltage for controlling a switching transistor in a pixel region to be turned off), so that the power input pin inputs the effective voltage in a display phase and inputs a synchronous driving signal in a touch phase, which enables that the gate line driving circuit provided by the at least one embodiment of the present disclosure to output a synchronous driving signal.

BRIEF DESCRIPTION OF THE DRAWINGS

In the following, drawings to be used in the embodiments will be briefly introduced.

DETAILED DESCRIPTION OF THE EMBODIMENTS

Hereinafter, the technical solutions in the embodiments of the present disclosure will be described clearly and comprehensively in combination with the drawings of the embodiments, obviously, these described embodiments are only parts of the embodiments of the present disclosure, rather than all of the embodiments thereof. All the other embodiments obtained by those of ordinary skill in the art based on the embodiments of the present disclosure without paying creative efforts fall into the protection scope of the present disclosure.

The inventor has noticed that the synchronous driving discussed in the Background part includes a requirement that the gate line driving signal for driving the gate electrode outputs a signal synchronized with the touch driving signal in the touch phase, but the known gate line driving circuit does not support this function.

First Embodiment

A gate line driving circuit is used to provide a signal for driving a gate line, an external driving chip (i.e., a gate driver) may be separately formed, or a gate line driving circuit may be directly integrated on an array substrate, to replace the external driver chip and become a GOA (Gate Driver on Array) unit. Application of this technique not only can reduce manufacturing procedures, reduce product costs, increase integration, but also can achieve aesthetic design of symmetry on both sides of the panel, leave out a bonding area and a fan-out wiring space of a gate circuit (Gate IC), thus achieving the design of a narrow border, facilitating an improvement of productivity and yield.

Figure 1:
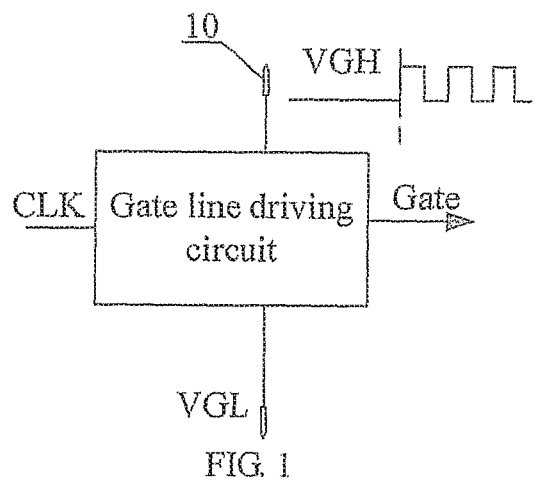
FIG. 1 is a schematic diagram of a gate line driving circuit provided in a first embodiment of the present disclosure.

FIG. 1 is a schematic diagram of a gate line driving circuit provided in the first embodiment of the present disclosure. As shown in FIG. 1, the gate line driving circuit comprises a power input pin (e.g., the positive power input pin 10 in FIG. 1) configured to input an effective voltage for controlling a switching transistor in a pixel region to be turned off, the power input pin inputs the effective voltage VGH in a display phase, and inputs a synchronous driving signal in a touch phase.

The power input pin in this embodiment is configured to input an effective voltage for controlling a switching transistor in a pixel region to be turned off, the effective voltage is outputted through an output terminal of the gate line driving circuit in a non-turned-on time domain of the gate line, so as to turn off the gate line. Generally, the gate line driving circuit is provided with a positive power input pin or a negative power input pin configured to input an effective voltage for controlling a switching transistor in a pixel region to be turned on or off respectively. In this embodiment, the power input pin (which may be a positive power input pin or a negative power input pin), which is configured to input an effective voltage for controlling a switching transistor in a pixel region to be turned off, inputs the effective voltage in a display phase, and inputs a synchronous driving signal in a touch phase. In the touch phase, the synchronous driving signal is outputted to a gate line through an output terminal of the gate line driving circuit, so as to achieve synchronous driving. The synchronous driving signal has the following characteristics: being applied to the gate line in the touch phase, so that a gate voltage performs synchronous driving along with the driving of touch electrodes, in this case, the other electrodes also perform a similar synchronous driving, so as to ensure that an amplitude of an output current of the OLED remains unchanged, which enables the touch function to be achieved without affecting the display effect. Those skilled in the art can set the synchronous driving signal according to a situation in practice, this embodiment makes no limitations thereto. Optionally, the synchronous driving signal is a superimposed signal of the effective voltage for controlling a switching transistor in a pixel region to be turned off and a touch driving signal.

Figure 2:
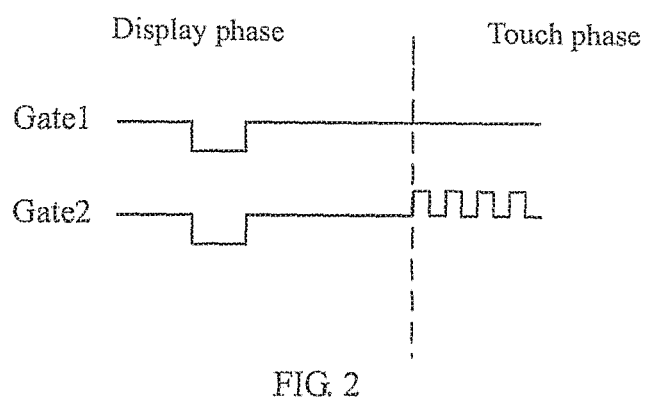
FIG. 2 is a comparison diagram of an output signal of the gate line driving circuit provided in the first embodiment of the present disclosure and an output signal of the gate line driving circuit already known.

FIG. 2 is a comparison diagram of an output signal Gate 2 of the gate line driving circuit provided in the first embodiment of the present disclosure and an output signal Gate 1 of the gate line driving circuit already known. As shown in FIG. 2, it is known that a waveform outputted by the gate line driving circuit in the display phase includes a turn-on voltage (VGH) for turning on the gate line; in the touch phase, a voltage at the power input pin is outputted through the output terminal of the gate line driving circuit, that is, the gate line driving circuit outputs a constant turn-off voltage in the touch phase, to cause the gate line to be always in a tuned-off state. In the display phase, in the gate line driving circuit provided by this embodiment, the power input pin inputs the effective voltage, the gate line driving circuit outputs, as being driven by an original signal, a waveform including a turn-on voltage sequence in the same way as the known solution; in the touch phase, the power input pin inputs the synchronous driving signal, and the synchronous driving signal is outputted through the output terminal of the gate line driving circuit, that is, the gate line driving circuit outputs the synchronous driving signal in the touch phase, so that the gate voltage performs the synchronous driving along with the driving of the touch electrode.

The effective voltage controlling a switching transistor in a pixel region to be turned off may be a positive power signal VGH, and may also be a negative power signal VGL, thus the above power input pin may be a positive power input pin or a negative power input pin.

For those skilled in the art to better understand the gate line driving circuit provided in the embodiment of the present disclosure, the technical solutions provided by the present disclosure will be explained in detail below by taking that the positive power input pin inputs the synchronous driving signal in the touch phase as an example.

Figure 3:
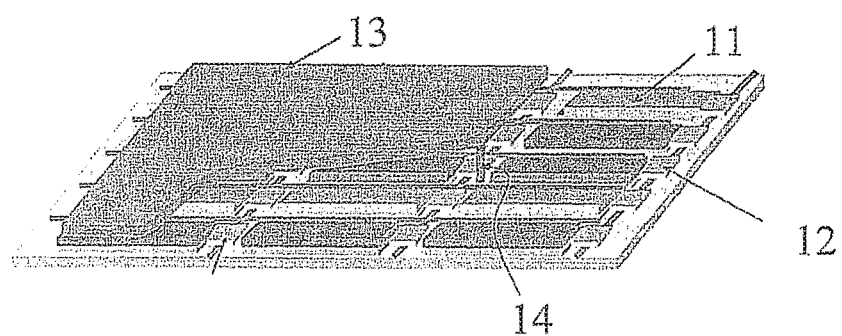
FIG. 3 is a schematic diagram of an In Cell AMOLED touch module in the first embodiment of the present disclosure.

FIG. 3 is a schematic diagram of an In Cell AMOLED touch module in the first embodiment of the present disclosure. As shown in FIG. 3, a pixel driving circuit is disposed in the pixel region 11. A cathode thereof is located at the uppermost of the entire function panel. Each block-shaped cathode electrode serves as a touch detection unit 13 by a way of segmenting and multiplexing the cathode electrode, then a connection is made by metal (a gate metal layer G1) of a thin film transistor region 12 in the below through a wiring 14 of a touch panel, thus serving as a metal conductive layer.

Figure 4:
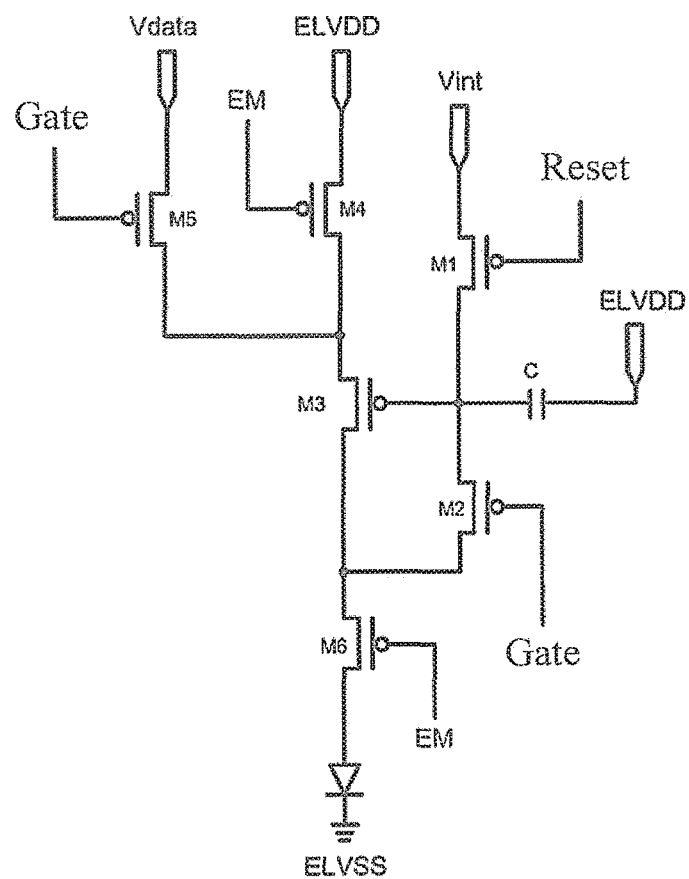
FIG. 4 is a schematic diagram of a 6T1C pixel circuit provided in the first embodiment of the present disclosure.
Figure 5:
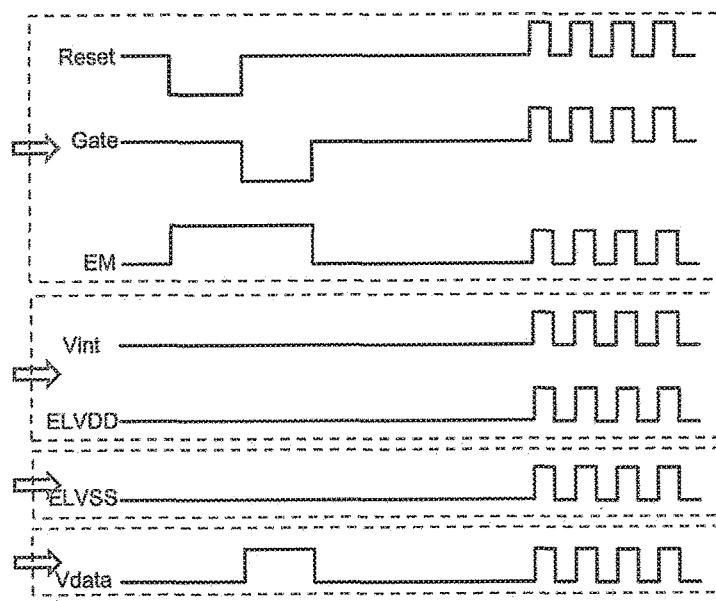
FIG. 5 is a timing sequence diagram of the respective signals in the pixel circuit shown in FIG. 4.

According to the principles of In Cell Touch, there are strict requirements on the capacitance-to-ground of the touch detection unit 13, a touch mode of the touch detection unit 13 requires that all the electrodes (the touch electrode and other counter electrodes) have to be driven synchronously in a touch phase, which aims to counteract an impact caused by the capacitance-to-ground on touch detection, accordingly, it is necessary to have a specific pixel circuit to correspond thereto, that is, it requires that when voltages in the respective paths in the pixel circuit drive along with the driving of the touch electrodes, an amplitude of an output current of the OLED must be ensured to remain unchanged. The pixel circuit designed according to this requirement is as shown in FIG. 4. FIG. 4 is a schematic diagram of a 6T1C pixel circuit provided in the first embodiment of the present disclosure. In this pixel circuit, M3 is a driving transistor (Driving TFT), the rest are a switching transistor (Switching transistor) each, and there is also a storage capacitor C. FIG. 5 is a timing sequence diagram of the respective signals in the pixel circuit shown in FIG. 4. As shown in FIG. 5, these signals include a reset signal Reset, a gate line driving signal Gate, an emission control signal EM, a reference potential Vint, a light emission operating voltage ELVDD, a light emission grounding voltage ELVSS, and a data voltage Vdata, these driving signals perform synchronous driving in the touch phase, wherein the reference potential Vint and the ELVDD need to be inputted externally through a flexible printed circuit (FPC), a touch channel (TX channel) outputs a TX signal and is connected to each ELVSS, Vdata is outputted from a Source Line, which facilitates achieving the synchronous driving easily; and the three paths of signals of Reset, Gate, EM output timing sequence signals through the GOA unit. However, the current AMOLED Driver IC does not support Reset and Gate lines to output the synchronous driving signal, the embodiment of the present disclosure provides a GOA unit that finally outputs a gate line driving timing sequence to exactly tally with this timing sequence requirement.

Figure 6:
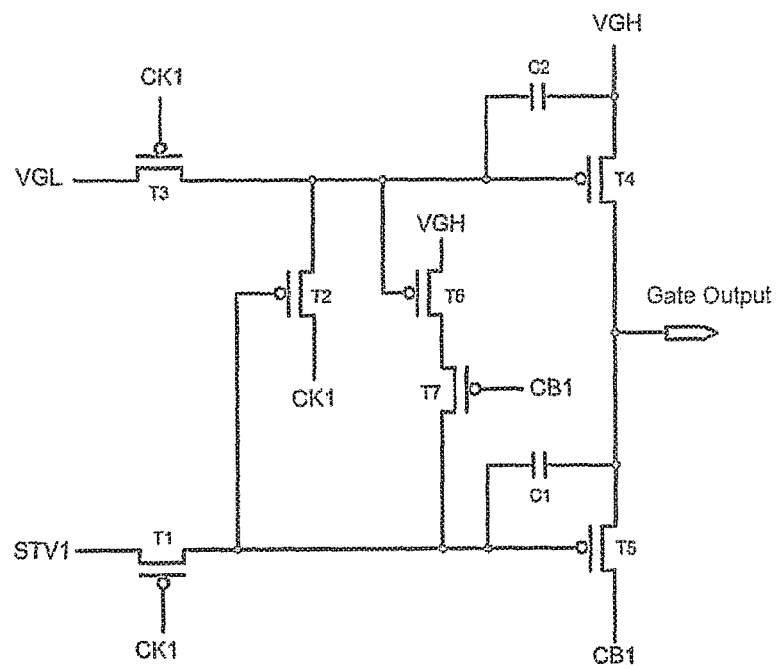
FIG. 6 is a schematic diagram of a specific gate line driving circuit provided in the first embodiment of the present disclosure.

FIG. 6 is a schematic diagram of a GOA unit (i.e., a gate line driving circuit) provided in the first embodiment of the present disclosure. As shown in FIG. 6, the GOA unit comprises a first thin film transistor T1, a first terminal of the first thin film transistor T1 being inputted with a start signal STV1, and a control terminal of the first thin film transistor T1 being inputted with a first clock signal CK1; a second thin film transistor T2, a first terminal of the second thin film transistor T2 being inputted with the first clock signal CK1, and a control terminal of the second thin film transistor T2 being connected to the second terminal of the first thin film transistor T1; a third thin film transistor T3, a first terminal of the third thin film transistor T3 being connected to a negative power input pin (the input pin marked as VGL in FIG. 6), and a control terminal of the third thin film transistor T3 being inputted with the first clock signal CK1; a fourth thin film transistor T4, a first terminal of the fourth thin film transistor T4 being connected to the positive power input pin (the input pin marked as VGH in FIG. 6), and a control terminal of the fourth thin film transistor T4 being connected to the second terminal of the third thin film transistor T3 and the second terminal of the second thin film transistor T2; a fifth thin film transistor T5, a first terminal of the fifth thin film transistor T5 being inputted with a first control signal CB1 which is phase-reversed with respect to the first clock signal CK1, a control terminal of the fifth thin film transistor T5 being connected to the second terminal of the first thin film transistor T1, and a second terminal of the fifth thin film transistor T5 being connected to the second terminal of the fourth thin film transistor T4 to form an output terminal (Gate Output) of a gate line driving signal; a sixth thin film transistor T6, a first terminal of the sixth thin film transistor T6 being connected to the positive power input pin, and a control terminal of the sixth thin film transistor T6 being connected to the second terminal of the third thin film transistor T3 and the second terminal of the second thin film transistor T2; a seventh thin film transistor T7, a first terminal of the seventh thin film transistor T7 being connected to the second terminal of the sixth thin film transistor T6, a control terminal of the seventh thin film transistor T7 being inputted with the first control signal CB1, and a second terminal of the seventh thin film transistor T7 being connected to the second terminal of the first thin film transistor T1 and the control terminal of the fifth thin film transistor T5; a first capacitor C1, two terminals of the first capacitor C1 being connected to the control terminal and the second terminal of the fifth thin film transistor T5, respectively; and a second capacitor C2, two terminals of the second capacitor C2 being connected to the control terminal and the first terminal of the fourth thin film transistor T4, respectively.

Each of the first to seventh thin film transistors (T1 to T7) is a P-type thin film transistor.

Figure 7:
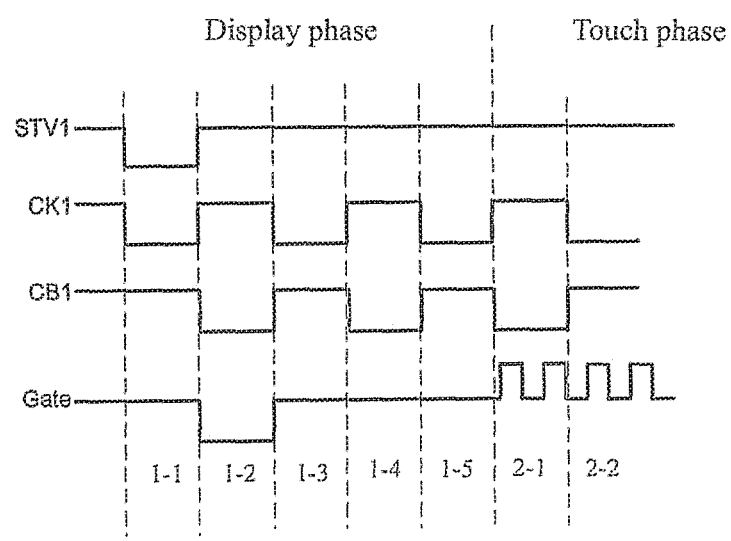
FIG. 7 is an operation timing sequence diagram of the gate line driving circuit shown in FIG. 6.

FIG. 7 is a timing sequence diagram of the GOA unit shown in FIG. 6. The positive power input pin inputs the effective voltage for turning off the gate line in the display phase, and inputs the synchronous driving signal in the touch phase, the synchronous driving signal may be a superimposed signal of the effective voltage for turning off the gate line and the touch driving signal.

Figure 8:
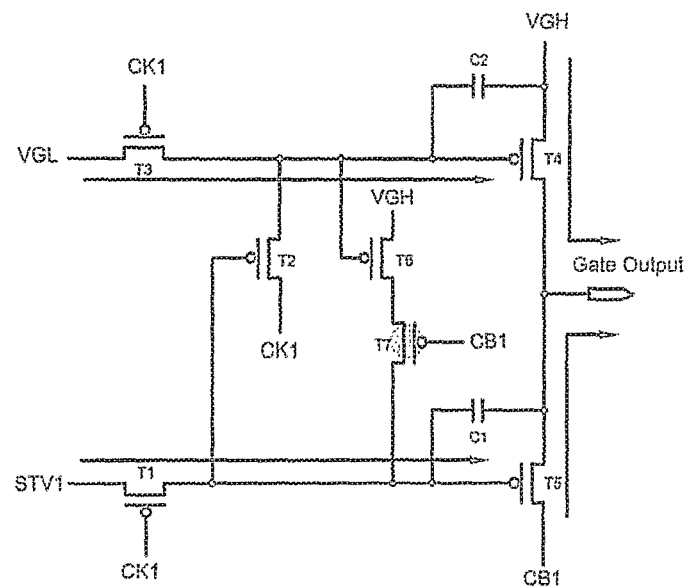
FIGS. 8(*a*) to 8(*f*) are schematic diagrams of the operation process of the gate line driving circuit shown in FIG. 6.
Figure 8:
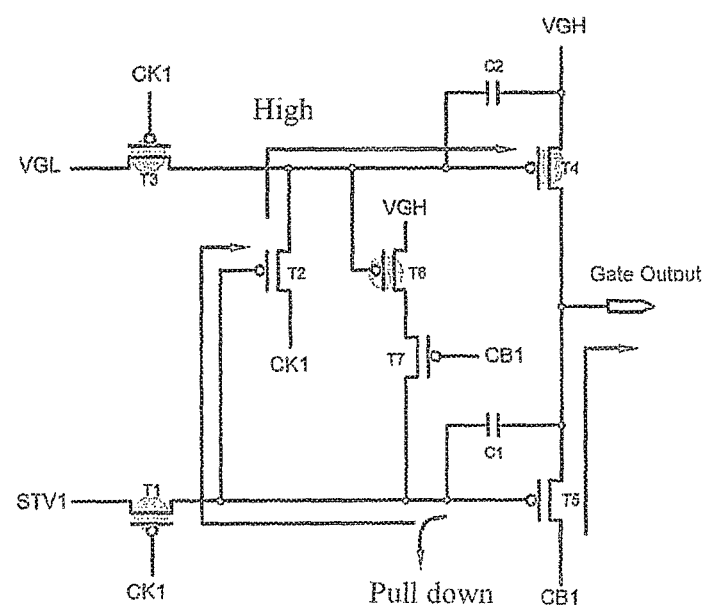
Figure 8:
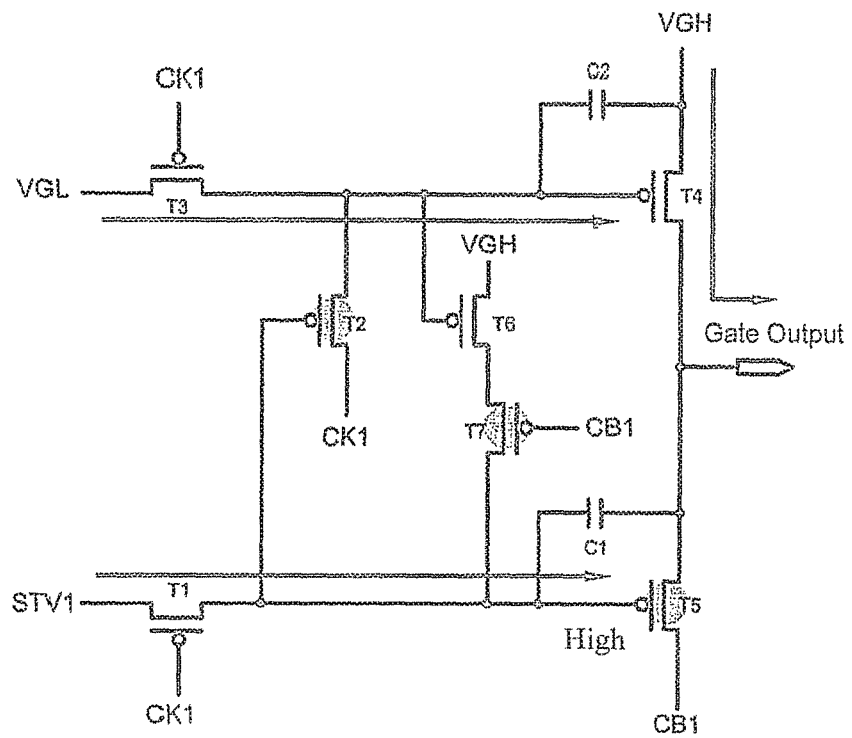
Figure 8:
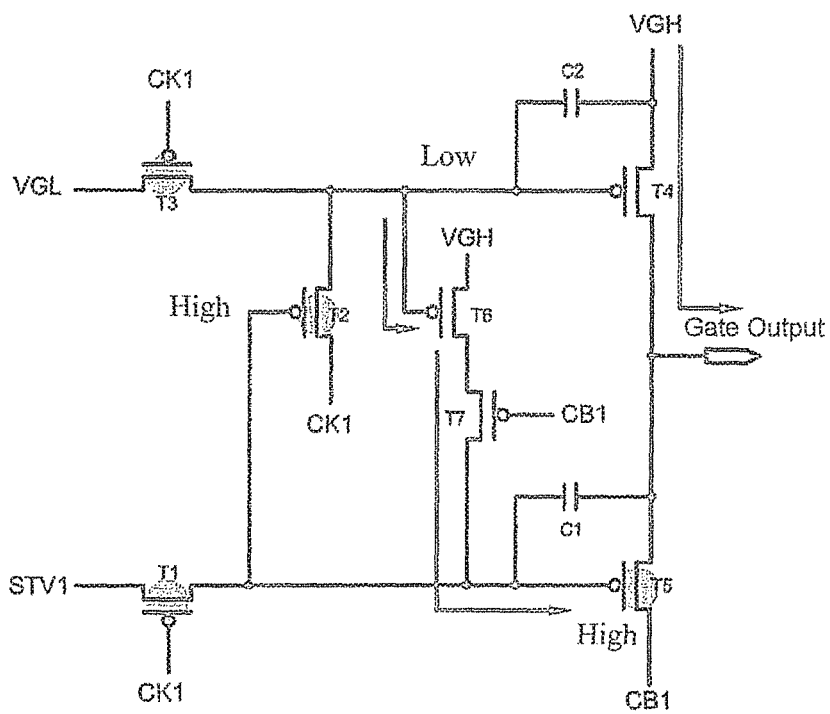
Figure 8:
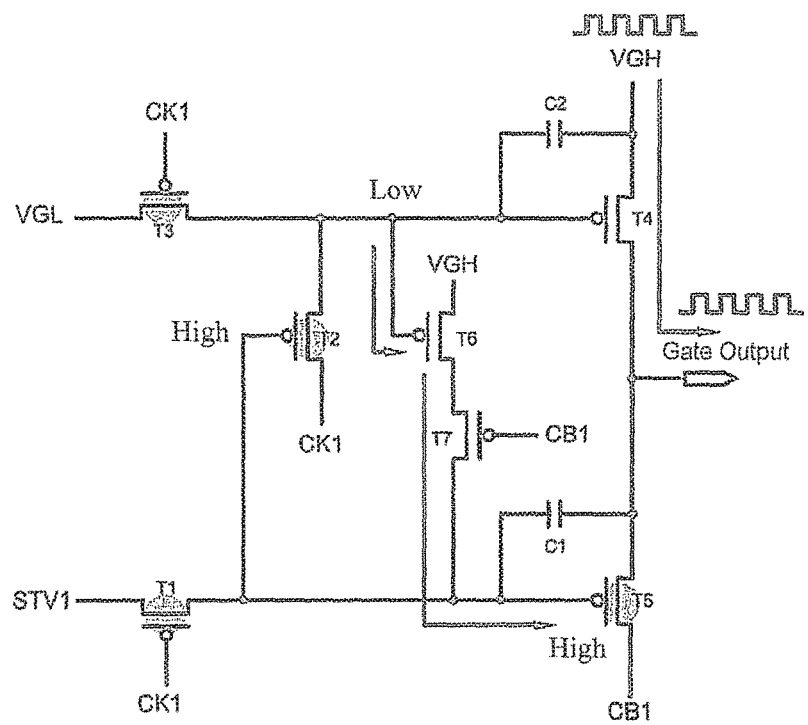
Figure 8:
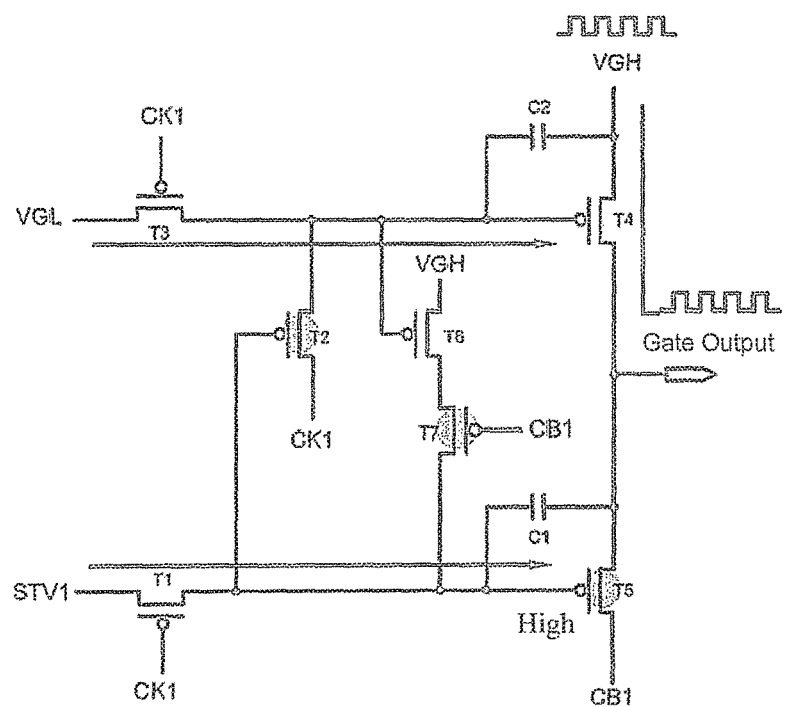

FIGS. 8(a) to 8(f) are schematic diagrams of the operation process of the gate line driving circuit shown in FIG. 6. As shown in FIGS. 7 and 8(a), in a time domain 1-1 of the display phase, the thin film transistors T1, T2, T3, T4, T5, T6 are turned on, the thin film transistor T7 is turned off, and the positive power input pin outputs a high voltage level through T4. As shown in FIGS. 7 and 8(b), in the time domain 1-2 of the display phase, the thin film transistors T2, T5 and T7 are turned on, the thin film transistors T1, T3, T4 and T6 are turned off, a low voltage level of the signal CB1 is outputted through T5. As shown in FIGS. 7 and 8(c), in a time domain 1-3 of the display phase, the thin film transistors T2, T5 and T7 are turned off, the thin film transistors T1, T3, T4, and T6 are turned on, the positive power input pin outputs a high voltage level through T4. As shown in FIGS. 7 and 8(d), in a time domain 1-4 of the display phase, the thin film transistors T1, T2, T3, and T5 are turned off, the thin film transistors T4, T6, and T7 are turned on, the positive power input pin outputs a high voltage level through T4.

As shown in FIGS. 7 and 8(e), in a time domain 2-1 of the touch phase, the thin film transistors T1, T2, T3, and T5 are turned off, the thin film transistors T4, T6, and T7 are turned on, the positive power input pin outputs a synchronous driving signal through T4. As shown in FIGS. 7 and 8(f), in a time domain 2-2 of the touch phase, thin film transistors T2, T5 and T7 are turned off, thin film transistors T1, T3, T4, and T6 are turned on, the positive power input pin outputs a synchronous driving signal through T4. In the remaining time domains of the touch phase, the case is similar to the aforesaid two time domains, also, the positive power input pin outputs a synchronous driving signal through T4. It can be seen that, in the time domains of the touch phase, the positive power input pin outputs a synchronous driving signal, the synchronous driving signal is a superimposed signal of the high voltage level (the effective voltage) originally outputted by the output terminal (Gate Output) of the gate line driving signal and the touch driving signal.

It needs to be noted that, each of the first to seventh thin film transistors (T1 to T7) is in the gate line driving circuit a P-type thin film transistor, the effective voltage that drives the gate line is a low voltage level pulse, but it is not actually limited thereto. In fact, the effective voltage that drives the gate line may also be a high voltage level pulse, in this case, the power input pin configured to input an effective voltage for controlling a switching transistor in a pixel region to be turned off is a negative power input pin. If it is desired to achieve synchronous driving of the outputs, it requires that the negative power input pin input the effective voltage (i.e., VGL) in the display phase and input the synchronous driving signal in the touch phase, and of course, it also requires to make some adaptive changes to a type selected for the respective thin film transistors in the gate line driving circuit, accordingly, change of a selected type may probably cause change of the connection, this requires no creative effort for those of ordinary skill in the art, thus falling into the protection scope of the present disclosure.

The embodiment of the present disclosure provides a circuit design of a GOA unit, on basis of the known GOA functional unit, through a combined action of the TFT switches and the signal timing sequence, the touch driving signal is superimposed on the effective voltage in the touch phase, so as to output a timing sequence waveform capable of driving the gate line and also achieving synchronous driving.

Second Embodiment

Similarly, an embodiment of the present disclosure also provides a circuit for outputting an emission control signal EM, comprising: a second power input pin configured to input an effective voltage for controlling an emission control transistor in a pixel region to be turned on, the second power input pin inputs the effective voltage in a display phase, and inputs a synchronous driving signal in a touch phase.

The circuit provided in this embodiment is configured to output an emission control signal EM, its principles are similar to those of the gate line driving circuit described above. The circuit configured to output an emission control signal EM is usually provided with a second power input pin, which is configured to input an effective voltage for controlling an emission control transistor in a pixel region to be turned on. In a time domain where it needs to control an emission control transistor in the pixel region to be turned on, by means of controlling turned-on of the thin film transistors in the circuit, an output channel is formed and the signal from the second power input pin is outputted to control whether OLED is in an emitting state. According to the embodiment of the present disclosure, the second power input pin inputs an effective voltage in a display phase and inputs a synchronous driving signal in a touch phase, in this way, it can be ensured that the emission control signal EM performs synchronous driving in the touch phase, to thereby reduce an affect caused by the touch function to displaying and at the same time ensure sensibility of touch control. The second power input pin described above may be a second positive power input pin or a second negative power input pin.

In this embodiment, the synchronous driving signal is configured to be applied to the pixel circuit through the output circuit that outputs the emission control signal EM in the touch phase, in this case, the other signal lines also perform similar synchronous driving, to ensure that an amplitude of the output current of the OLED remains unchanged, so that the display effect will not be affected while the touch control function is achieved. Optionally, the synchronous driving signal is a superimposed signal of the effective voltage for controlling an emission control transistor in a pixel region to be turned on and the touch driving signal.

Figure 9:
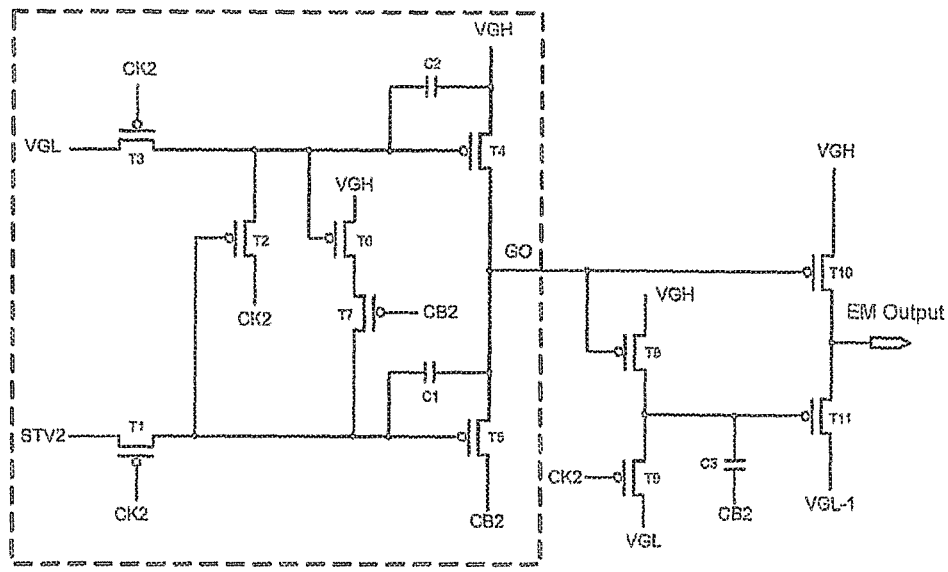
FIG. 9 is a schematic diagram of a circuit for outputting an emission control signal provided in a second embodiment of the present disclosure.

FIG. 9 is a schematic diagram of a circuit for outputting an emission control signal provided in a second embodiment of the present disclosure. In the following, a circuit (which may be provided on an array substrate, just like the gate line driving circuit, as commonly referred to by those skilled in the art as a GOA unit) for outputting an emission control signal as provided by the embodiment of the present disclosure will be described in detail with that the second negative power input pin inputs an effective voltage that controls an emission control transistor in the pixel region to be turned on as an example.

As shown in FIG. 9, the circuit comprises: a first thin film transistor T1, a first terminal of the first thin film transistor T1 being inputted with a start signal STV2, and a control terminal of the first thin film transistor T1 being inputted with a second clock signal CK2; a second thin film transistor T2, a first terminal of the second thin film transistor T2 being inputted with the second clock signal CK2, and a control terminal of the second thin film transistor T2 being connected to the second terminal of the first thin film transistor T1; a third thin film transistor T3, a first terminal of the third thin film transistor T3 being connected to a negative power input pin (the input pin marked as VGL in FIG. 9), and a control terminal of the third thin film transistor T3 being inputted with the second clock signal CK2; a fourth thin film transistor T4, a first terminal of the fourth thin film transistor T4 being connected to the positive power input pin (the input pin marked as VGH in FIG. 9), and a control terminal of the fourth thin film transistor T4 being connected to the second terminal of the third thin film transistor T3 and the second terminal of the second thin film transistor T2; a fifth thin film transistor T5, a first terminal of the fifth thin film transistor T5 being inputted with a second control signal CB2 which is phase-reversed with respect to the second clock signal CK2, a control terminal of the fifth thin film transistor T5 being connected to the second terminal of the first thin film transistor T1, and a second terminal of the fifth thin film transistor T5 being connected to the second terminal of the fourth thin film transistor T4 to form a first output terminal GO; a sixth thin film transistor T6, a first terminal of the sixth thin film transistor T6 being connected to the positive power input pin, and a control terminal of the sixth thin film transistor T6 being connected to the second terminal of the third thin film transistor T3 and the second terminal of the second thin film transistor T2; a seventh thin film transistor T7, a first terminal of the seventh thin film transistor T7 being connected to the second terminal of the sixth thin film transistor T6, a control terminal of the seventh thin film transistor T7 being inputted with the second control signal CB2, and a second terminal of the seventh thin film transistor T7 being connected to the second terminal of the first thin film transistor T1 and the control terminal of the fifth thin film transistor T5; a first capacitor C1, two terminals of the first capacitor C1 being connected to the control terminal and the second terminal of the fifth thin film transistor T5, respectively; and a second capacitor C2, two terminals of the second capacitor C2 being connected to the control terminal and the first terminal of the fourth thin film transistor T4, respectively; an eighth thin film transistor T8, a first terminal of the eighth thin film transistor T8 being connected to the positive power input pin, and a control terminal of the eighth thin film transistor T8 being connected to the first output terminal GO; a ninth thin film transistor T9, a first terminal of the ninth thin film transistor T9 being connected to the negative power input pin, a control terminal of the ninth thin film transistor T9 being inputted with the second clock signal CK2, and a second terminal of the ninth thin film transistor T9 being connected to the second terminal of the eighth thin film transistor T8; and a tenth thin film transistor T10, a first terminal of the tenth thin film transistor T10 being connected to the positive power input pin, and a control terminal of the tenth thin film transistor T10 being connected to the first output terminal GO; an eleventh thin film transistor T11, a first terminal of the eleventh thin film transistor T11 being connected to the second negative power input pin (the input pin marked as VGL-1 in FIG. 9), a control terminal of the eleventh thin film transistor T11 being connected to the second terminal of the eighth thin film transistor T8 and the second terminal of the ninth thin film transistor T9, and a second terminal of the eleventh thin film transistor T11 being connected to the second terminal of the tenth thin film transistor T10 to form an emission control signal output terminal (EM output); and a third capacitor C3, one terminal of the third capacitor C3 being connected to the second terminal of the eighth thin film transistor T8, the second terminal of the ninth thin film transistor T9 and the control terminal of the eleventh thin film transistor T11, and the other terminal of the third capacitor C3 being inputted with the second control signal CB2.

It needs to be noted that, in this embodiment, the positive power input pin and the negative power input pin input the effective voltage for controlling turning on and off the switching transistor in the pixel region according to the known technical solutions (that is, the synchronous driving signal is not inputted in the touch phase), the second negative power input pin inputs the effective voltage for controlling the emission control transistor in the pixel region to be turned on in the display phase and inputs the synchronous driving signal in the touch phase.

The second negative power input pin and the negative power input pin in the driving circuit of an upper stage may be differentiated here, to be applied with a signal required by the upper phase, respectively; or they may be implemented by using the same signal, that is, the second negative power input pin and the negative power input pin may both input the effective voltage for controlling the emission control transistor in the pixel region to be turned on in the display phase and input the synchronous driving signal in the touch phase, and the same synchronous driving function can be achieved.

It can be seen that the partial circuit constituted by T1 to T7 and C1 and C2 in this embodiment is the same as the gate line driving circuit described in the first embodiment except that there is a difference in the driving timing sequence, a pulse length of the driving timing sequence STV2, CK2, and CB2 in this partial circuit is twice that of STV1, CK1, and CB1, a pulse length of the output signal GO is also twice that of the signal Gate, the operation process is basically the same, no more details are repeated here.

Figure 10:
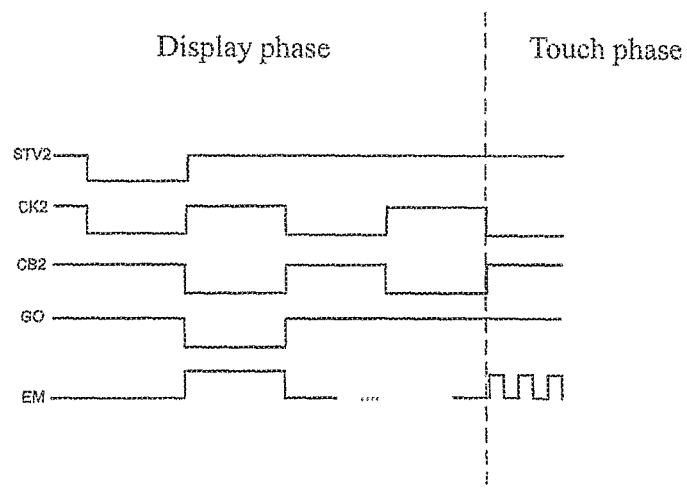
FIG. 10 is an operation timing sequence diagram of the circuit shown in FIG. 9.
Figure 11:
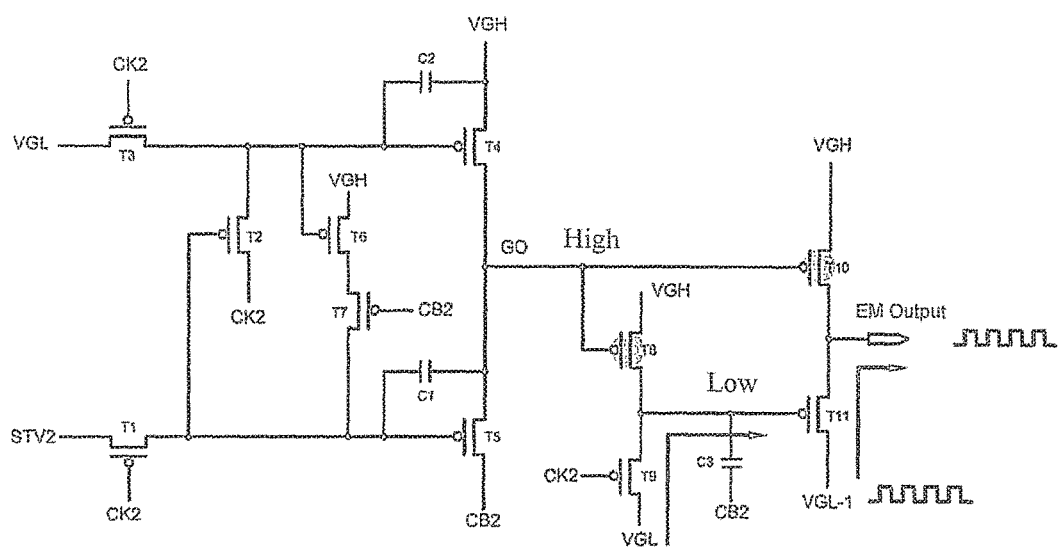
FIG. 11 is a schematic diagram of the operation process of the circuit shown in FIG. 9 in the touch phase.

FIG. 10 is an operation timing sequence diagram of the circuit shown in FIG. 9. As shown in FIG. 10, in the display phase, the second negative power input pin (the input pin marked as VGL-1 in FIG. 10) inputs the second negative power signal, the operation process is similar to the known technical solution, no more details are repeated here; in the touch phase, the second negative power input pin outputs the synchronous driving signal, in this case, the EM signal is superimposed with the touch driving signal on basis of the original low voltage, that is, the synchronous driving signal is outputted to meet the requirements of synchronous driving, the operation process of the partial circuit composed by T8 to T11 and C3 in the circuit shown in FIG. 9 in the touch phase is as shown in FIG. 11.

The circuit for outputting an emission control signal provided in this embodiment realizes the synchronous driving of the emission control signal, which facilitates implementing synchronous driving of the pixel circuit, and ensures that an amplitude of an output current of the OLED remains unchanged, which enables the touch function to be achieved without affecting the display effect.

An embodiment of the present disclosure further provides a display device, comprising the gate line driving circuit described above and/or the circuit for outputting an emission control signal described above. The display device in this embodiment solves the problem that the AMOLED driver chip under current mass production does not support the Reset line and the Gate line to output the synchronous driving signal, and ensures that the synchronous driving mode in the touch phase has no influence on light emission of the OLED (the synchronous driving process ensures that an outputted photocurrent is consistent with a normal light-emitting state). The display device may be any product or component having a display function such as OLED panel, electronic paper, mobile phone, tablet computer, television set, display, notebook computer, digital photo frame, navigator etc.

Therefore, although the P-type thin film transistor is described as an example in the embodiments of the present disclosure, it is to be understood that the specific type of the respective thin film transistors (i.e., each of the thin film transistors is an N type or a P type, a depletion type or an enhanced type) cannot be used to limit the circuit, change of a selected type and change of the connection caused by the former made by those of ordinary skill in the art under the premise of paying no creative efforts all fall into the protection scope of the present disclosure.

For the sake of clarity of explanation, the words "first" and "second" are adopted in the present disclosure to classify and differentiate similar items, and the words "first" and "second" are not indented to limit the present disclosure in terms of number, they are only an exemplary illustration of alternatives, obvious similar variants or related extensions that can be conceived by those skilled in the art in light of what is disclosed herein are within the protection scope of the present disclosure.

The above described are merely some specific embodiments of the present disclosure, however, the protection scope of the present disclosure is not limited thereto, modifications or replacements that are easily conceivable for those skilled in the art within the technique range disclosed in the present disclosure should all fall into the protection scope of the present disclosure. The protection scope of the present disclosure should be determined according to the appended claims.

The present application claims the priority of the Chinese patent application No. 201510680789.4 filed on Oct. 19, 2015, which is incorporated as part of the present application by reference herein in its entirety.

What is claimed is:

1. A gate line driving circuit, comprising:
a power input pin configured to input an effective voltage for controlling a switching transistor in a pixel region comprising a pixel to be turned off, wherein the power input pin inputs the effective voltage in a display phase, and inputs a synchronous driving signal in a touch phase;
a first thin film transistor, a first terminal of the first thin film transistor being inputted with a start signal, and a control terminal of the first thin film transistor being inputted with a first clock signal;
a second thin film transistor, a first terminal of the second thin film transistor being inputted with the first clock signal, and a control terminal of the second thin film transistor being connected to a second terminal of the first thin film transistor;
a third thin film transistor, a first terminal of the third thin film transistor being connected to a negative power input pin, and a control terminal of the third thin film transistor being inputted with the first clock signal;
a fourth thin film transistor, a first terminal of the fourth thin film transistor being connected to the power input pin, and a control terminal of the fourth thin film transistor being connected to the second terminal of the third thin film transistor and the second terminal of the second thin film transistor;
a fifth thin film transistor, a first terminal of the fifth thin film transistor being inputted with a first control signal which is phase-reversed with respect to the first clock signal, a control terminal of the fifth thin film transistor being connected to the second terminal of the first thin film transistor, and a second terminal of the fifth thin film transistor being connected to the second terminal of the fourth thin film transistor to form an output terminal of a gate line driving signal;
a sixth thin film transistor, a first terminal of the sixth thin film transistor being connected to the power input pin, and a control terminal of the sixth thin film transistor being connected to the second terminal of the third thin film transistor and the second terminal of the second thin film transistor;

a seventh thin film transistor, a first terminal of the seventh thin film transistor being connected to the second terminal of the sixth thin film transistor, a control terminal of the seventh thin film transistor being inputted with the first control signal, and a second terminal of the seventh thin film transistor being connected to the second terminal of the first thin film transistor and the control terminal of the fifth thin film transistor;

a first capacitor, two terminals of the first capacitor being connected to the control terminal and the second terminal of the fifth thin film transistor, respectively; and a second capacitor, two terminals of the second capacitor being connected to the control terminal and the first terminal of the fourth thin film transistor, respectively.

2. The gate line driving circuit according to claim 1, wherein the power input pin is a positive power input pin or a negative power input pin.

3. The gate line driving circuit according to claim 2, wherein the synchronous driving signal is a superimposed signal of the effective voltage and a touch driving signal.

4. The gate line driving circuit according to claim 3, wherein the power input pin is a positive power input pin.

5. The gate line driving circuit according to claim 4, wherein each of the first to seventh thin film transistors is a P-type thin film transistor.

6. The gate line driving circuit according to claim 1, wherein the synchronous driving signal is a superimposed signal of the effective voltage and a touch driving signal.

7. The gate line driving circuit according to claim 6, wherein the power input pin is a positive power input pin.

8. The gate line driving circuit according to claim 7, wherein each of the first to seventh thin film transistors is a P-type thin film transistor.

9. A display device, comprising the gate line driving circuit according to claim 1.

10. The display device according to claim 9, wherein the power input pin is a positive power input pin or a negative power input pin.

11. The display device according to claim 9, wherein the synchronous driving signal is a superimposed signal of the effective voltage and a touch driving signal.

12. The display device according to claim 11, wherein the power input pin is a positive power input pin.

13. The display device according to claim 12, wherein each of the first seventh thin film transistors is a P-type thin film transistor.

14. A circuit for outputting an emission control signal, comprising:

a second power input pin configured to input an effective voltage for controlling an emission control transistor in a pixel region comprising a pixel to be turned on, wherein the second power input pin inputs the effective voltage in a display phase, and inputs a synchronous driving signal in a touch phase;

a first thin film transistor, a first terminal of the first thin film transistor being inputted with a start signal, and a control terminal of the first thin film transistor being inputted with a second clock signal;

a second thin film transistor, a first terminal of the second thin film transistor being inputted with the second clock signal, and a control terminal of the second thin film transistor being connected to a second terminal of the first thin film transistor;

a third thin film transistor, a first terminal of the third thin film transistor being connected to a negative power input pin, and a control terminal of the third thin film transistor being inputted with the second clock signal;

a fourth thin film transistor, a first terminal of the fourth thin film transistor being connected to a positive power input pin, and a control terminal of the fourth thin film transistor being connected to the second terminal of the third thin film transistor and the second terminal of the second thin film transistor;

a fifth thin film transistor, a first terminal of the fifth thin film transistor being inputted with a second control signal which is phase-reversed with respect to the second clock signal, a control terminal of the fifth thin film transistor being connected to the second terminal of the first thin film transistor, and a second terminal of the fifth thin film transistor being connected to the second terminal of the fourth thin film transistor to form a first output terminal;

a sixth thin film transistor, a first terminal of the sixth thin film transistor being connected to the positive power input pin, and a control terminal of the sixth thin film transistor being connected to the second terminal of the third thin film transistor and the second terminal of the second thin film transistor;

a seventh thin film transistor, a first terminal of the seventh thin film transistor being connected to the second terminal of the sixth thin film transistor, a control terminal of the seventh thin film transistor being inputted with the second control signal, and a second terminal of the seventh thin film transistor being connected to the second terminal of the first thin film transistor and the control terminal of the fifth thin film transistor;

a first capacitor, two terminals of the first capacitor being connected to the control terminal and the second terminal of the fifth thin film transistor, respectively;

a second capacitor, two terminals of the second capacitor being connected to the control terminal and the first terminal of the fourth thin film transistor, respectively;

an eighth thin film transistor, a first terminal of the eighth thin film transistor being connected to the positive power input pin, and a control terminal of the eighth thin film transistor being connected to the first output terminal;

a ninth thin film transistor, a first terminal of the ninth thin film transistor being connected to the negative power input pin, a control terminal of the ninth thin film transistor being inputted with the second clock signal, and a second terminal of the ninth thin film transistor being connected to the second terminal of the eighth thin film transistor;

a tenth thin film transistor, a first terminal of the tenth thin film transistor being connected to the positive power input pin, and a control terminal of the tenth thin film transistor being connected to the first output terminal;

an eleventh thin film transistor, a first terminal of the eleventh thin film transistor being connected to the second power input pin, a control terminal of the eleventh thin film transistor being connected to the second terminal of the eighth thin film transistor and the second terminal of the ninth thin film transistor, and a second terminal of the eleventh thin film transistor being connected to the second terminal of the tenth thin film transistor to form an emission control signal output terminal; and a third capacitor, one terminal of the third capacitor being connected to the second terminal of the eighth thin film transistor, the second terminal of the ninth thin film transistor and the control terminal of the eleventh thin film transistor, and the other terminal of the third capacitor being inputted with the second control signal.

15. The circuit according to claim 14, wherein the second power input pin is a second positive power input pin or a second negative power input pin.

16. The circuit according to claim 15, wherein the synchronous driving signal is a superimposed signal of the effective voltage and a touch driving signal.

17. The circuit according to claim 16, wherein the second power input pin is a second negative power input pin.

18. The circuit according to claim 14, wherein the synchronous driving signal is a superimposed signal of the effective voltage and a touch driving signal.

19. The circuit according to claim 18, wherein the second power input pin is a second negative power input pin.

20. A display device, comprising the circuit for outputting an emission control signal according to claim 14.

* * * * *